(12) United States Patent
Höft

(10) Patent No.: US 10,355,639 B2
(45) Date of Patent: Jul. 16, 2019

(54) SAFE PHOTOVOLTAIC SYSTEM

(71) Applicant: Phoenix Contact GmbH & Co. KG, Blomberg (DE)

(72) Inventor: Wolfgang Höft, Breslauer Ring 9 (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 15/757,015

(22) PCT Filed: Aug. 31, 2016

(86) PCT No.: PCT/EP2016/070504
§ 371 (c)(1),
(2) Date: Mar. 2, 2018

(87) PCT Pub. No.: WO2017/037110
PCT Pub. Date: Mar. 9, 2017

(65) Prior Publication Data
US 2018/0248513 A1    Aug. 30, 2018

(30) Foreign Application Priority Data
Sep. 3, 2015 (DE) .......................... 10 2015 114 755

(51) Int. Cl.
*G01R 31/26* (2014.01)
*H02S 50/10* (2014.01)
(Continued)

(52) U.S. Cl.
CPC ............ *H02S 50/10* (2014.12); *H01L 31/042* (2013.01); *H02G 3/08* (2013.01); *H02S 40/34* (2014.12); *H02S 50/00* (2013.01)

(58) Field of Classification Search
CPC ...... G01R 31/40; G01R 31/42; G01R 31/405; G01R 31/024; G01R 31/025;
(Continued)

(56) References Cited

U.S. PATENT DOCUMENTS 6,650,031 B1   11/2003   Goldack
7,772,716 B2   8/2010    Shaver, II et al.
(Continued)

FOREIGN PATENT DOCUMENTS

AU   2012225199 A1   10/2013
CN   101951190 A     1/2011
(Continued)

OTHER PUBLICATIONS

Int. Search Report and Written Opinion, Int. Application No. PCT/EP2012/003459, Int. Filing Date: Aug. 14, 2012, Applicant: Phoenix Contact GmbH & Co. KG, dated Dec. 21, 2012.
(Continued)

*Primary Examiner* — Thang X Le
(74) *Attorney, Agent, or Firm* — Reising Ethington PC

(57) ABSTRACT

The present disclosure relates to a photovoltaic system comprising at least one string of series-connected solar modules and an inverter, a test circuit which can be connected between the string and the inverter in at least one string line, and a testing method in particular for checking whether the inverter-side section of the string lines is closed and whether the inverter is connected.

17 Claims, 7 Drawing Sheets

(51) Int. Cl.
*H02S 50/00* (2014.01)
*H02S 40/34* (2014.01)
*H01L 31/042* (2014.01)
*H02G 3/08* (2006.01)

(58) Field of Classification Search
CPC ..... G01R 31/2605; G01R 31/08; H02S 50/10; H02S 40/34; H02S 40/30; H02S 40/32; H01L 31/042; H01L 31/02021; H02C 3/08; H02J 3/38; H02J 3/385
See application file for complete search history.

(56) References Cited

U.S. PATENT DOCUMENTS

| | | | |
|---|---|---|---|
| 8,809,699 B2 | 8/2014 | Funk | |
| 8,859,884 B2 | 10/2014 | Dunton et al. | |
| 8,963,375 B2 | 2/2015 | DeGraaff | |
| 2008/0106250 A1 | 5/2008 | Prior et al. | |
| 2009/0014057 A1 | 1/2009 | Croft et al. | |
| 2009/0141522 A1* | 6/2009 | Adest | H02J 1/102 363/55 |
| 2009/0207543 A1 | 8/2009 | Boniface et al. | |
| 2010/0043870 A1 | 2/2010 | Bennett et al. | |
| 2010/0139734 A1 | 6/2010 | Hadar et al. | |
| 2010/0241375 A1 | 9/2010 | Kumar et al. | |
| 2010/0300508 A1 | 12/2010 | Maier et al. | |
| 2010/0317782 A1 | 12/2010 | Hattori et al. | |
| 2010/0321148 A1 | 12/2010 | Gevorkian | |
| 2011/0172842 A1 | 7/2011 | Makhota et al. | |
| 2012/0050924 A1 | 3/2012 | Matsuo et al. | |
| 2012/0194003 A1 | 8/2012 | Schmidt et al. | |
| 2013/0015875 A1 | 1/2013 | Kumar | |
| 2013/0051092 A1* | 2/2013 | Cooper | H02J 3/383 363/37 |
| 2014/0137920 A1 | 5/2014 | Berg | |
| 2014/0301003 A1* | 10/2014 | Jankowski | H01L 31/02021 361/57 |
| 2014/0311546 A1 | 10/2014 | Kruse et al. | |
| 2015/0008748 A1* | 1/2015 | Deboy | H02J 3/383 307/77 |
| 2016/0006392 A1* | 1/2016 | Hoft | H02S 50/10 361/78 |
| 2016/0018456 A1* | 1/2016 | Yilmaz | H02S 50/10 324/761.01 |
| 2017/0338770 A1* | 11/2017 | Higuchi | H02S 50/00 |

FOREIGN PATENT DOCUMENTS

| | | |
|---|---|---|
| CN | 201918923 U | 8/2011 |
| CN | 201927619 U | 8/2011 |
| CN | 102598287 A | 7/2012 |
| CN | 103081269 A | 5/2013 |
| DE | 19844977 | 4/2000 |
| DE | 102007037130 B3 | 4/2009 |
| DE | 102009051186 | 5/2010 |
| DE | 102009022569 A1 | 12/2010 |
| DE | 102010023549 A1 | 12/2011 |
| DE | 102010054354 | 6/2012 |
| DE | 102011079074 A1 | 1/2013 |
| DE | 102011107365 | 1/2013 |
| DE | 102013101314 A1 | 8/2014 |
| EP | 2256819 A1 | 12/2010 |
| JP | 2006278755 A | 10/2006 |
| WO | 2009073868 | 6/2009 |
| WO | 2010078303 A2 | 7/2010 |
| WO | 2011023732 A2 | 3/2011 |
| WO | 2011079074 A1 | 6/2011 |
| WO | 2012079742 A1 | 6/2012 |
| WO | 2013000762 A2 | 1/2013 |
| WO | 2013007638 A2 | 1/2013 |
| WO | 2013010083 A2 | 1/2013 |

OTHER PUBLICATIONS

German Office Action, Serial No. 102013101314.7, Applicant: Phoenix Contact GmbH & Co. KG, dated Dec. 20, 2013.
PCT International Search Report, Int. Serial No. PCT/EP2014/052663, Int. Filing Date: Feb. 11, 2014, Applicant: Phoenix Contact GmbH & Co. KG, dated May 26, 2014.
Chinese Office Action, Application No. 201480019920.6, Applicant: Phoenix Contact GmbH & Co. KG, Title of Invention: Safe Photovoltaic System, dated Mar. 2, 2017, and English language translation.
German Office Action, Serial No. 102011110682.4, Applicant: Phoenix Contact GmbH & Co. KG, dated Apr. 22, 2014.
Chinese Office Action, Application No. 201480019926.3, Applicant; Phoenix Contact GmbH & Co. KG, Title: Safe Photvoltaic System, dated Jun. 3, 2016.
PCT International Search Report and Written Opinion, Int. Serial No. PCT/EP2014/052666, Int. Filing Date: Feb. 11, 2014, Applicant: Phoenix Contact GmbH & Co. KG, dated May 15, 2014.
Chinese Office Action, Application No. 201280040488.X, Applicant: Phoenix Contact GmbH & Co. KG, Title: Socket for a Solar Panel with a Protective Circuit, dated Aug. 5, 2015.
Search result from the German Patent and Trademark Off, dated Nov. 18, 2014.
German Office Action, Applicant: Phoenix Contact GmbH & Co. KG, Serial No. 102015114755.6, dated May 20, 2016.
Eng. Translation of Int. Preliminary Report on Patentability, Int. Serial No. PCT/EP2012/003459, Int. Filing Date: Aug. 14, 2012, Applicant: Phoenix Contact GmbH & Co. KG, dated Feb. 25, 2014.
U.S. Office Action U.S. Appl. No. 14/239,285, filed Apr. 11, 2014, First Named Inventor: Martin Jankowski, dated Dec. 31, 2015.
U.S. Office Action, U.S. Appl. No. 14/766,516, Applicant: Phoenix Contact GmbH & Co. KG, dated Aug. 9, 2017.
PCT English Translation of International Preliminary Examination Report, Int. Application No. PCT/EP2014/052663, Int. Filing Date: Feb. 11, 2014, Applicant: Phoenix Contact GmbH & Co. KG, dated Aug. 11, 2015.
International Search Report, Int. Serial No. PCT/EP2016/070504, Int. Filing Date: Aug. 31, 2016, Applicant: Phoenix Contact GmbH & Co. KG, dated Nov. 8, 2016.
International Written Opinion, Int. Serial No. PCT/EP2016/070504, Int. Filing Date: Aug. 31, 2016, Applicant: Phoenix Contact GmbH & Co. KG, dated Nov. 8, 2016.
English Translation of the International Preliminary Report on Patentability, Int. Serial No. PCT/EP2016/070504, Int. Filing Date: Aug. 31, 2016, Applicant: Phoenix Contact GmbH & Co. KG, dated Mar. 15, 2018.
Chinese Search Report, Application No. 201680061131.8, Filing Date: Aug. 31, 2016, Applicant: Phoenix Contact GmbH & Co. KG, dated Mar. 22, 2019.
Chinese Office Action with English Translation, Application No. 201680061131.8, Applicant: Phoenix Contact GmbH & Co. KG, Title: Safe Photovoltaic System, dated Apr. 1, 2019.

* cited by examiner

SAFE PHOTOVOLTAIC SYSTEM

TECHNICAL FIELD

The present disclosure relates to a photovoltaic system comprising at least one string of series-connected solar modules and an inverter, to a test circuit which can be connected between the string and the inverter in at least one string line, and to a testing method.

BACKGROUND

Hitherto, solar modules often have not been equipped with special safety provisions. The solar connection box (also known as solar junction box) provided on each solar module is essentially used to connect the conductor strips (also referred to as ribbons) of the solar module and to accommodate the bypass diodes. Such simple solar modules will provide voltage at the output contacts of the solar junction box as soon as they are irradiated.

Typically, the solar modules are series-connected so as to form strings in order to obtain a high string voltage. This voltage of the solar modules connected into strings can amount to several 100 V, and in large systems operation voltages of about 1000 V or even more may exist, which is a hazardous voltage when contacted. Also, a solar power plant may optionally comprise a plurality of strings connected in parallel.

Thus, in case of adequate irradiation, very high voltages might be generated during the installation of the solar modules and electrical wiring thereof in the string, so that cautious handling and a special contact protection is necessary. The same applies to maintenance works and incidents, such as in case of a fire.

In such simple photovoltaic systems, the first possibility for disconnecting the solar generator voltage from the power grid is at the generator junction box. Therefore, in case of damage caused by fire, water, hail, or in case of other malfunctions of the solar modules or the string lines, there is no possibility in these simple solar modules to de-energize or disconnect from voltage the part of the photovoltaic system that includes the solar modules and the string lines.

Safety devices for switching off the individual solar modules in cases of fire or faults are known (e.g. DE 10 2009 024 516 A1). However, such solutions are usually only intended for a one-time emergency shutdown.

From EP 2 726 889 B1, a photovoltaic module is known which may create a safe shutdown in the case a module has not been installed or connected, or in case of a fault. For this purpose, a unit with a test device is integrated either directly in the junction box of the photovoltaic module or locally associated with a photovoltaic module. In order to switch on the photovoltaic module, the test device of the unit checks whether a fault state still exists or whether the individual photovoltaic module is connected to an inverter. In any case, the shutdown of the photovoltaic module takes place locally on the photovoltaic module itself, so that the unit with the test device is arranged locally on the photovoltaic module in any case. However, to provide the test device locally on the individual photovoltaic module is complicated and therefore disadvantageous. Furthermore, central control of a string that comprises a plurality of photovoltaic modules is in principle not possible in this way. Moreover, surge currents or impulse currents might flow in this case, which may adversely affect the service life of the components involved in current flow. Furthermore, the input capacitor of the inverter might be relatively large, which may result in the source being unable to deliver enough power at startup, so that the charging of the input capacitor is only possible to a limited extent.

DE 10 2011 110 682 A1 describes a junction box for a solar panel with a protective circuit, which is in a protective state when being delivered and switches into the protective state in case of an incident. In the protective state, the solar cells of the solar panel are disconnected from the string. The protective circuit may have external terminals, such as those of the junction box, are short-circuited in the protective state. In this manner a voltage is reliably prevented from being applied to the external terminals of, e.g., the junction box in the protective state, and despite of that, the electrical circuit of the string is closed in the protective state, so that other solar panels can possibly continue to feed solar power. Furthermore, this also allows to centrally check and, if necessary, control the entire string.

Furthermore, from WO 2014/122325 A1 a safe photovoltaic system is known which comprises a central start box that starts an entire string comprising a plurality of series-connected solar modules each one in particular including a protective or safety circuit, either upon initial connection or upon reconnection. Since a dangerous contact voltage of, e.g., up to 1000 volts or more, might be applied at the string lines of such a string comprising a plurality of solar modules, the start box checks whether the circuit via the string lines between the start box and the entire string of the plurality of solar modules, i.e. between the start box and all safety circuits of the solar modules, is closed, in order to prevent a dangerous open contact voltage from being applied at possibly open terminals between the start box and the plurality of safety circuits. The section between the central start box and the inverter is not checked here. This is the starting point of the present disclosure which in particular is a further development of a photovoltaic system that comprises solar modules each of which have a safety circuit and a start box according to WO 2014/122325 A1, the subject matter of which is therefore incorporated herein by reference.

GENERAL DESCRIPTION

Therefore, it is an object of the present disclosure to provide a photovoltaic system which meets high safety requirements and which in particular defines a protective state and provides for safe switching from the protective state to the operating state, in particular after installation, maintenance, sunrise, and/or incidents.

Another aspect of the object may be to ensure that the electrical circuit of the string lines between the inverter and a start box is closed, the start box being connected in the string lines at a central location where, in the operating state, the total voltage of the string is applied, which is hazardous when contacted, before all solar modules are switched into the operating state under central control of the start box.

Further aspects of the object will become apparent from the following description or the particular advantages which are achieved with preferred embodiments.

The object is achieved by the subject matter of the independent claims. Advantageous embodiments are specified in the dependent claims.

The present disclosure relates to a photovoltaic system comprising at least one string of a plurality of series-connected solar modules, and in the final assembled normal state comprising an inverter for converting the direct current generated by the string, e.g. for feeding into a power grid.

In the normal state, the positive end of the string of the plurality of series-connected solar modules is connected via a positive pole string line to the positive pole DC input of the inverter, and the negative end of the string of the plurality of series-connected solar modules is connected via a negative pole string line to the negative pole DC input of the inverter which includes a DC-side capacitor. In other words, each of the two ends of the string is electrically connected to the respective associated DC input of the inverter via a respective string line, and in the operating state a voltage hazardous when contacted is applied between the two ends of the string, namely the total voltage of the entire serial string.

Furthermore, the system comprises a test circuit which is connected in the positive pole string line between the positive end of the string of the plurality of series-connected solar modules and the positive pole DC input of the inverter and/or in the negative pole string line between the negative end of the string of the plurality of series-connected solar modules and the negative pole DC input of the inverter, so that on the string side the test circuit is connected to at least one of the positive and negative ends of the entire string comprising the plurality of series-connected solar modules, and on the inverter side, i.e. on the side of the test circuit opposite the string side, it is connected to at least one of the positive pole and negative pole DC inputs. Thus, the test circuit is connected in the string lines at a point where the entire string voltage may be applied, so that in the operating state of the photovoltaic system the entire string voltage is applied to the test circuit. In other words, the test circuit is connected at a central location between the string comprising the plurality of series-connected solar modules and the inverter. Optionally, the test circuit furthermore centrally controls all smart solar modules of the string.

The test circuit includes at least a first switch for disconnecting the positive pole string line between the positive end of the string and the positive pole DC input of the inverter, or for disconnecting the negative pole string line between the negative end of the string and the negative pole DC input of the inverter.

The string now preferably defines not only the operating state in which the solar power is supplied to the inverter and fed into the grid, but additionally a protective state in which at least a majority of the solar modules is switched off, so that the string applies at most a not dangerous contact voltage to the string lines. This is in particular achieved by the fact that at least a majority of the solar modules of the serial string is equipped with a safety circuit according to WO 2014/122325 A1, which is hereby incorporated by reference in this regard.

By virtue of these safety circuits, the string can automatically switch from the operating state into the protective state, e.g. when night falls, or the string can be manually switched from the operating state into the protective state, e.g. for maintenance purposes. When the string is in the protective state and is desired to switch back to the operating state, e.g. in the morning at sunrise, or after completion of maintenance work, then it is intended to put all the safety circuits back into the operating state. This can in particular be effected for the entire string using a start box according to WO 2014/122325 A1, which is hereby incorporated by reference in this regard. For this purpose, the start box checks current flow through the string lines between the start box and the solar modules. The present disclosure now relates to the checking of the inverter-side string lines, in particular prior thereto. Accordingly, the central test circuit first performs a testing process on the inverter side of the test circuit, in order to check whether the inverter is actually connected to the string lines at that moment and whether the inverter-side section of the string lines is closed, i.e. not interrupted. For this purpose, the test circuit opens the first switch that is series-connected in one of the two string lines. As a result, the DC-side capacitor of the inverter is electrically disconnected from the string and/or from a voltage supply of the test circuit, at least on one side. This disconnection causes a voltage drop between the two inverter-side outputs of the test circuit. On the basis of the time profile of the voltage drop caused on the DC-side capacitor of the inverter by the electrical disconnection of the DC-side capacitor of the inverter from the string and/or from the voltage supply of the test circuit, the test circuit is able to determine whether the inverter is actually connected to the string lines at the time of opening the first switch, and whether the inverter-side section of the string lines is interrupted or not.

Reasons for the inverter to not be connected at that moment may be, for example, that the inverter has not yet been connected during installation of the system, or that the DC isolation switch was activated, so that there is a galvanic isolation at the DC input of the inverter.

In other words, the test circuit is a central test circuit that is responsible for all solar modules of the entire string, for checking whether the inverter is actually connected at that moment and/or whether the section of the string lines on the inverter side of the test circuit is closed, that is to say not interrupted. This has the advantage that only a single test circuit is used for the entire string comprising a plurality of series-connected solar modules, and that the enabling or startup of the entire string can be controlled centrally.

The determination in response to the voltage drop after the disconnection of the DC-side input capacitor is easy to perform and reliable.

Furthermore, the input capacitor of the inverter is preferably slowly charged by the solar modules and is then separated from the string to measure the voltage drop. Few or no surge or impulse currents will flow in this case, which may create a long service life of the components involved in the current flow.

Furthermore, the input capacitor of the inverter might be relatively large, so that at power up the source may not be able to provide enough power and therefore charging of the input capacitor would only be possible to a limited extent. Since the present disclosure uses the voltage drop in the discharge process, these problems may not occur.

The test circuit may be adapted to be responsive to the test result to put the string from the protective state into the operating state, i.e. to enable it, or vice versa, so that the test circuit preferably is a test and enabling circuit.

The photovoltaic system furthermore comprises a disconnection device or DC isolation device, by means of which the inverter-side section of the string lines can be interrupted. This isolation device is also referred to as a "fire emergency switch" and can be integrated in the inverter or implemented as a separate unit.

Thus, if the result of the determination of the voltage drop in the inverter side testing process indicates that the inverter is connected to the string lines at the time the first switch is opened, the test circuit can accordingly initiate further testing and/or startup processes in the string, e.g. at the solar modules, in order to put the string from the protective state into the operating state. This can mean, for example, that the test circuit subsequently performs a further, string-side testing process, in particular according to WO 2014/122325 A1, and, if the result is positive, puts the individual safety circuits on the solar modules into the operating state. In other words, the present test circuit may be part of the central start box between the string and the inverter according to WO 2014/122325 A1.

However, if the result of the determination of the voltage drop already indicates that the inverter is not connected to the string lines at the time the first switch is opened, or that the inverter-side section of the string lines is interrupted, the test circuit will neither initiate the string-side testing process nor will it put the string into the operating state, rather it will close the first switch again. After a predetermined time, the inverter-side testing process is then automatically repeated. This will be performed until the result of the determination of the voltage drop after the disconnection indicates that the inverter is connected to the string lines at the time the first switch is opened, and/or that the inverter-side section of the string lines is closed. Accordingly, the inverter-side testing process is automatically repeated regularly until the result is positive, in order to then automatically perform the string-side testing and/or startup processes.

Preferably, the test circuit determines the voltage drop by comparing the voltages before and after opening the first switch and/or by a voltage waveform measurement after opening the first switch. For example, the voltage just before opening the first switch may be compared with the voltage at a predefined time after opening the switch, such as after a few milliseconds, which is accomplished easily and reliably.

Since in particular the entire string of the plurality of series-connected solar modules has associated therewith a single test circuit for all solar modules, the test circuit in particular is connected remotely from the solar modules in the positive pole string line and/or the negative pole string line. This has the advantage that the test circuit can be connected in the string lines near or directly in front of the inverter, for example, so that it does not need to be located for instance on the roof, with difficult accessibility, but can be located within the building and thus is easily accessible to the user.

Preferably, the test circuit is accommodated in a start box, and the start box is connected in the positive pole string line between the positive end of the string comprising the plurality of series-connected solar modules and the positive pole DC input of the inverter and in the negative pole string line between the negative end of the string comprising the plurality of series-connected solar modules and the negative pole DC input of the inverter, so that the positive pole string line and the negative pole string line are electrically routed through the start box. The test circuit may be integrated in the start box of WO 2014/122325 A1, so that the start box checks the string lines on the string side and on the inverter side of the start box and the actual connection of the inverter at that moment.

Accordingly, the start box with the test circuit is connected in the positive pole string line and/or in the negative pole string line remote from the solar modules, so that the positive pole string line is formed by a string-side section extending from the positive end of the string to the start box and an inverter-side section extending from the start box to the positive pole inverter input, and/or the negative pole string line is formed by a string-side section extending from the negative end of the string to the start box and an inverter-side section extending from the start box to the negative pole inverter input.

Preferably, the test circuit comprises a second switch arranged on the string side of the serial first switch, which short-circuits the first and second string lines on the string side of the first switch when the inverter-side testing process determines the voltage drop across the DC-side input capacitor of the inverter. This may prevent the measurement of the voltage drop from being interfered by a possibly not dangerous contact voltage of the string via an optionally provided diode parasitic to the first switch.

The first and second switches are preferably the same switches as shunt switch 53 and isolating switch 54 in WO 2014/122325 A1.

According to a preferred embodiment of the present disclosure, the first and/or second switches are implemented as semiconductor switching elements, in particular FETs.

Preferably, the first FET switch is configured as a break contact switch, which is closed in the normal state, and/or the second FET switch is configured as a make contact switch, which is open in the normal state. In the normal state of the first and/or second switches the test circuit or the start box is therefore in the operating state and thus maintains the DC-side capacitor of the inverter in a charged state.

The solar modules each comprise a solar junction box, through which the connection elements or connecting strips of the associated solar module are electrically connected. At least some of the solar modules include a safety circuit which defines an operating state and a safe state, and the respective solar module feeds solar power into the string lines in the operating state, and does not feed solar power into the string lines in the safe state.

Preferably, the string comprises a plurality of solar modules that include the safety circuit which in the dark, in case of an incident, or by user intervention puts these solar modules from the operating state into the safe state in which the respective solar module does not apply any voltage to the string lines. These solar modules which include the safety circuit are also referred to as smart solar modules.

According to a first alternative, the string may comprise only smart solar modules. In this case, the start box has a separate power grid adapter or its own power supply, for powering the electronic components of the start box in the safe state and keeping the DC-side input capacity charged.

According to a second alternative, the string comprises a plurality of smart solar modules and at least one startup solar module which does not have to be actively switched into the operating state, but automatically applies voltage to the string lines in case of appropriate irradiation and thus electrically powers the start box and the test circuit, even if the smart solar modules of the string are in the safe state. If a string comprises 20 solar modules, for example, each one with a nominal voltage of 40 V, 19 solar modules will for instance be smart, and one solar module includes no safety circuit, thus providing the startup solar module. In the protective state, therefore, the 19 smart solar modules will be in the safe state, so that only the single startup solar module supplies sufficient voltage to the start box or test circuit. Although photovoltaically generated electrical power is provided from the string in the protective state, the voltage will therefore still be below the threshold of a dangerous contact voltage, although the entire string provides 800 V of nominal voltage in the operating state, which is a dangerous, or hazardous, contact voltage.

If the result of the determination of the voltage drop in the inverter-side testing process indicates that the inverter is connected to the string lines at the time the first switch is opened and that the inverter-side section of the string lines is closed, the test circuit initiates a string-side testing process which checks whether the circuit of the string lines on the string side of the test circuit is closed, and if the test result is positive, puts the safety circuits of the solar modules into the operating state, so that then the entire string, i.e. all solar modules, will supply electrical power to the inverter. The switching of the safety circuits of the smart solar modules preferably occurs with some delay, so that it may be ensured after the string-side testing process that prior to the switching into the operating state the first switch is closed and the second switch is open.

In other words, the test circuit, which in this case may be referred to as a test and enabling circuit, may be responsive to the test result, i.e. in particular, if the test result is positive, to switch the string from the protective state into the operating state, i.e. to enable it. This can be done by the test and enabling circuit by switching the safety circuits of the smart solar modules into the operating state in response to the test result, i.e. in particular if the test result is positive. The test and enabling circuit may put the string or the safety circuits of the smart solar modules into the operating state after one or more further testing processes, for example after a string-side testing process as described above. However, it should not be ruled out that the enabling is effected without further testing processes, i.e. directly.

If a string is employed in which a plurality of smart solar modules and at least one startup solar module are series-connected, the DC-side capacitor of the inverter is kept charged by the at least one startup solar module prior to the inverter-side testing process, i.e. before the first switch is opened, in order to create a charged state of the DC-side (input) capacitor of the inverter for the inverter-side testing process at the time the first switch is opened. If a string is employed which comprises only smart solar modules, the DC-side capacitor of the inverter is kept charged by a power supply of the test circuit prior to the inverter-side testing process, i.e. before the first switch is opened, in order to create a charged state of the DC-side capacitor of the inverter for the inverter-side testing process at the time the first switch is opened.

The subject matter of the present application also includes the test circuit for performing the inverter-side testing process and/or for performing the string-side testing process and/or for switching the smart solar modules from the safe state into the operating state.

A further subject matter of the present application is the testing method for the photovoltaic system for checking whether the inverter is actually connected to the string lines at that moment and/or whether the inverter-side section of the string lines is closed, wherein in the protective state of the photovoltaic system (solar modules in the safe state), in which at least some of the solar modules of the string are switched off such that the string in the protective state does not apply a dangerous contact voltage to the string lines, the following steps are performed:
  a) prior to the inverter-side testing process, but in the protective state, maintaining a DC-side capacitor of the inverter in a charged state with a starting voltage which is significantly reduced compared to the string voltage and is not dangerous when contacted, using the startup solar module or a power supply of the test circuit; subsequently,
  b) still in the protective state, performing the inverter-side testing process, in which the DC-side capacitor of the inverter is disconnected from the starting voltage at least on one side; and
  c) still in the protective state, in response to the voltage drop caused on the DC-side capacitor of the inverter by the disconnection of the DC-side capacitor of the inverter, determining whether the inverter is actually connected to the string lines at that moment and/or whether the inverter-side section of the string lines is closed or not.

The present disclosure will now be explained in more detail by way of multiple possible embodiments and with reference to the figures in which the same and similar elements are partly denoted by the same reference numerals. The features of the various possible embodiments may be combined with each other.

BRIEF DESCRIPTION OF THE FIGURES

In the figures.

DETAILED DESCRIPTION

Figure 1:
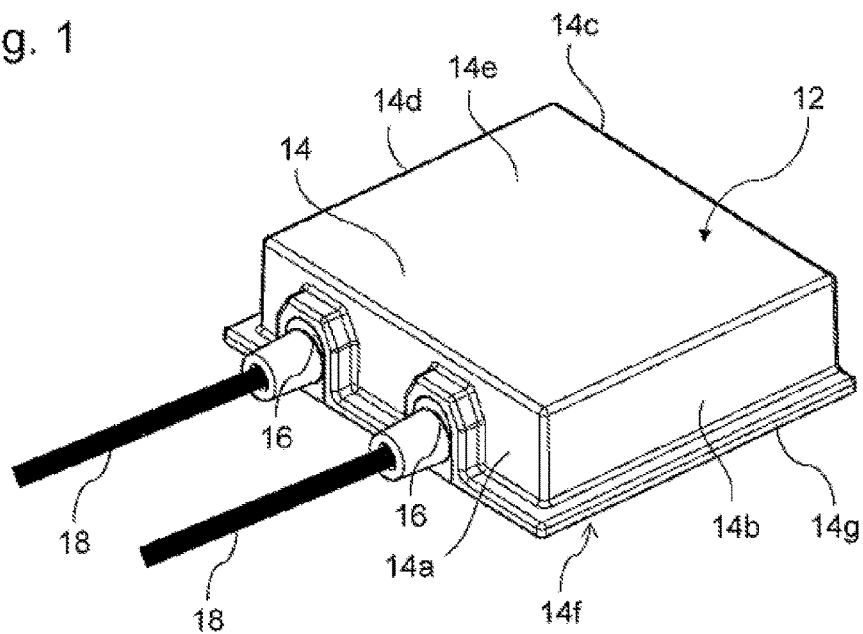
FIG. 1 is a perspective view of a typical solar junction box.

FIG. 1 shows a solar junction box 12 comprising a junction box housing 14 for being mounted on the rear side of a solar module. The dielectric junction box housing 14 has a hat-like shape, with circumferential side walls 14a to 14d and a cover 14e. On the bottom surface 14f of junction box housing 14, not visible in FIG. 1, openings are provided through which the conductor ribbons extending out of the solar module enter the solar junction box 12 to be electrically connected there. On one of the side walls, 14a, the junction box housing 14 has two cable feedthroughs 16 through which the string line 18 extends into the solar junction box 12 to be connected inside junction box housing 14, for example by means of contact terminals, not shown, in order to deliver the electrical power generated by the solar module. A collar 14g serves for adhering the solar junction box on the solar module. For the basic structural design of solar junction boxes reference is further made to DE 10 2007 037 130 A1, and DE 10 2007 042 547 A1, and DE 10 2007 051 134 A1, respectively.

Figure 2:
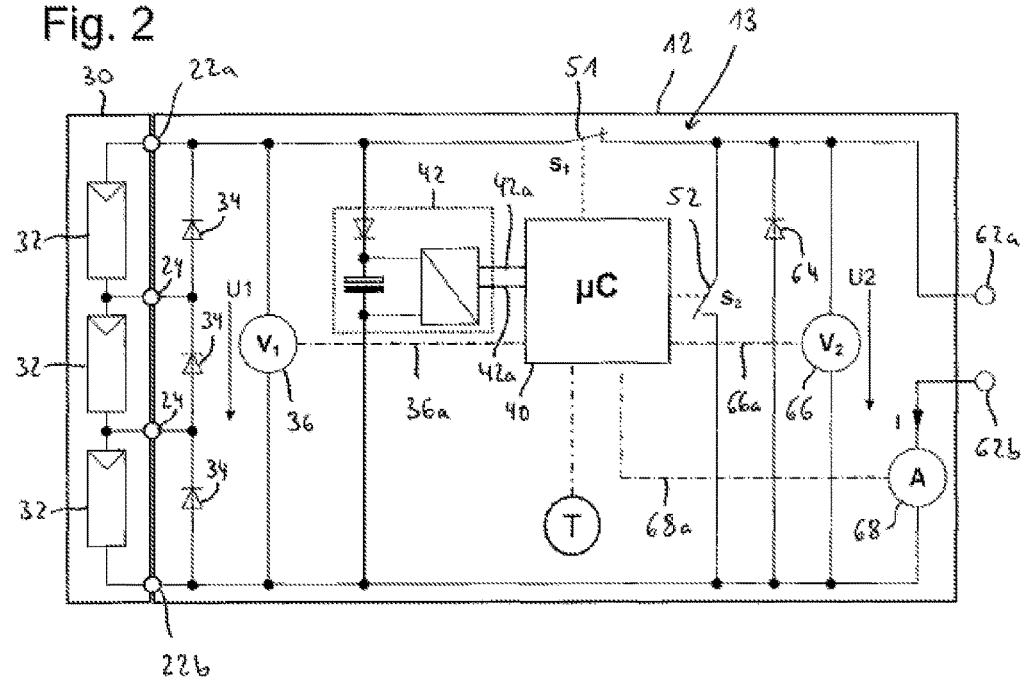
FIG. 2 is a block diagram of a solar module with a smart solar junction box, in the operating state.

FIG. 2 shows a block diagram of solar junction box 12 which is connected to input-side positive and negative connection elements 22a, 22b and, in this example via two intermediate taps 24, to the respective conductor ribbons of the solar module 30. Bypass diodes 34 are connected in parallel with the solar cells or solar module units 32 in order to be able to compensate for partial shading of the solar module 30.

Solar junction box 12 comprises a safety circuit 13 which permits to switch the solar junction box 12 from the operating state into the safe state and vice versa and which will be described in more detail below. In the example shown in FIGS. 2 and 3, the safety circuit 13 is directly integrated in solar junction box 12. However, it is also possible for the safety circuit 13 to be installed in a separate housing (not shown) in the vicinity of the solar junction box 12 on the associated solar module 30, in particular for retrofit concepts. However, even in this case each solar module 30 preferably has associated therewith an own safety circuit 13, which is capable of individually disconnecting the respective solar module 30 downstream of the safety circuit 13. Such solar modules 30 each including an individually associated safety circuit 13 are also referred to as smart solar modules 30 herein.

A voltage sensor 36 ($V_1$) connected in parallel to the solar module 30 measures the module voltage U1 and is read out by a control device in the form of a microcontroller 40 via a link 36a. Furthermore, a power supply unit 42 is connected in parallel with the solar module 30 to power the microcontroller 40 via supply lines 42a, so that the microcontroller is able to control the solar junction box 12. Solar junction box 12 includes a serial circuit breaker or isolating switch 51 (51) connected in series with the solar module 30, and this isolating switch is closed in the operating state as illustrated in FIG. 2 in order to deliver, via the string cabling, the power that has been photovoltaically generated by the solar module 30. Output-side positive and negative connection elements 62a, 62b can be short-circuited by a short-circuiting switch 52 (S2) in solar junction box 12, and this short-circuiting switch 52 is open in the operating state. A central bypass diode 64 between positive and negative connection elements 62a, 62b and short-circuiting switch 52 provides another bypass, for example in the event of a malfunction of short-circuiting switch 52.

An output-side voltage sensor 66 measures the string voltage (U2), regardless of the switching state of switches 51 and 52, and this sensor 66 is read out by microcontroller 40 via link 66a. A current sensor 68 measures the string current in the operating state illustrated in FIG. 2, on the one hand, and on the other hand, measures a starting current or detects a start signal in the safe state illustrated in FIG. 3, and is read out by microcontroller 40 via link 68a. Microcontroller 40 reads out the input-side voltage sensor 36, the output-side voltage sensor 66, and the current sensor 68, and controls the isolating switch 51 and the short-circuiting switch 52 in response to the measured values.

Figure 3:
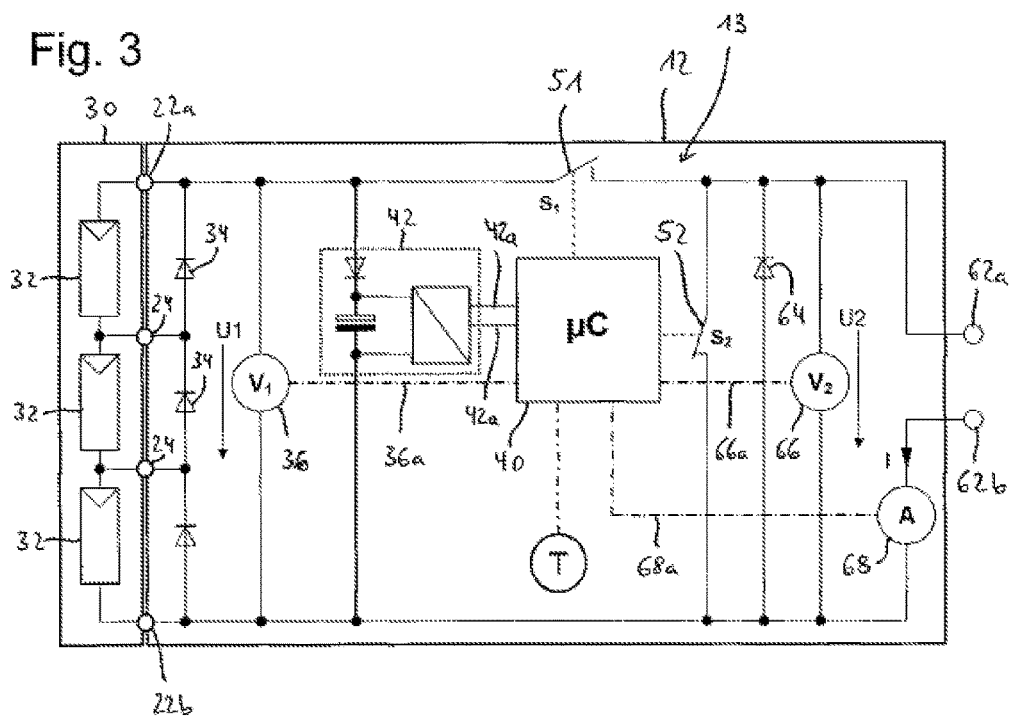
FIG. 3 shows the solar module of FIG. 2, but in the safe state.

FIG. 3 shows a block diagram of the smart solar module 30 in the safe state. In the safe state the isolating switch 51 is open and the short-circuiting switch 52 is closed so that, on the one hand, the smart solar module 30 is disconnected from string 20, and on the other hand, the string 20 is closed by the short-circuiting switch 52. Even in the safe state, power supply unit 42 is powered by the associated solar module 30, provided that the solar module 30 is irradiated. The power supply unit 42 in turn powers the microcontroller 40 so that the latter remains in operation even in the safe state, provided that irradiation is sufficient. In other words, even in the safe state shown in FIG. 3, the microcontroller 40 is able to read out the input-side and/or output-side voltage sensors 36, 66 and/or in particular current sensor 68, and/or to control switch 51 and/or 52. Preferably, the isolating switch 51 is configured as a normally open switch, and/or the short-circuiting switch 52 is configured as a normally closed switch, so that the safe state illustrated in FIG. 3 corresponds to the non-operating state of switches 51, 52. This has the advantage that at the latest when, due to insufficient irradiation, the solar module no longer provides enough power for supplying the microcontroller 40 with electric power, the smart solar junction box 12 will automatically switch into the safe state.

Now, when all solar modules 30 of a string 20 are in the safe state this means that no photovoltaically generated current flows, and the safe state will not be readily exited, even if, for instance, the sun rises and irradiation is sufficiently strong. Simply opening the short-circuiting switch 52 and closing the isolating switch 51 would lead to a situation where hazardous contact voltages might be produced, if a plurality of solar modules 30 would do this at the same time. Therefore, in order to enable and startup the smart solar modules 30, a starting current is injected into the string 20 from a central start box 70 which is external with respect to the solar modules, the string 20 being also closed in the safe state of the solar modules 30.

Figure 4:
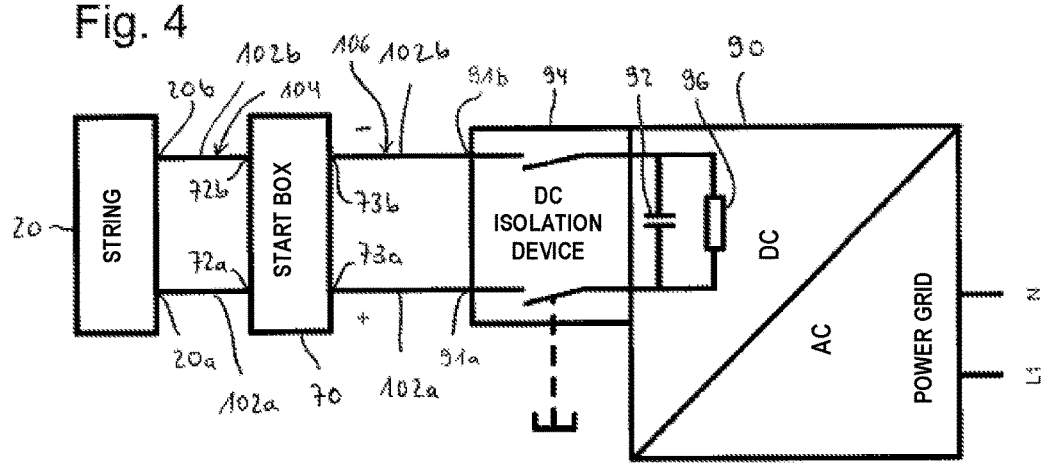
FIG. 4 is a simplified overview block diagram of a photovoltaic system comprising a string of series-connected solar modules, a start box, and an inverter.

Referring to FIG. 4, the start box 70 is connected to the positive and negative ends 20a, 20b of the string 20 via a respective string line 102a, 102b, string 20 comprising a plurality of series-connected solar modules. Thus, in the present example, the start box 70 is connected in both string lines, i.e. in the plus pole string line 102a and in the minus pole string line 102b, that means double-polar on both sides, in series between the string 20 and the inverter 90, the string 20 comprising a serial chain of solar modules 30 with the respectively associated safety circuits 13. For this purpose, the start box 70 is connected to the string 20 via two string-side input terminals 72a, 72b, the string 20 comprising a plurality of solar modules, at least some of which are smart, and via the two inverter-side output terminals 73a, 73b the start box 70 is connected to the positive pole DC input 91a and the negative pole DC input 91b of the inverter 90. In other words, on the string side, the start box 70 is connected to the positive and negative ends 20a, 20b of the string 20, so that in the operating state the voltage of the entire string 20 is applied at the start box 70, which is a hazardous contact voltage. Depending on the size and number of the series-connected solar modules, this might be up to 1000 V or more, for example.

Thus, the start box 70 divides the positive pole string line 102a and the negative pole string line 102b which connect the positive end 20a of string 20 to the positive pole DC input 91a of the inverter 90 and the negative end 20b of string 20 to the negative pole DC input 91b of the inverter 90 in a string-side section 104 between the two ends 20a, 20b of the string 20 and the start box 70, and an inverter-side section 106 between the start box 70 and the inverter 90. That means, the start box 70 is a central unit for the string 20 comprising a plurality of series-connected solar modules and is arranged remote from the individual solar modules, closer to the inverter 90, and that in the operating state, the hazardous contact voltage of the entire string 20 is applied at the start box 70, which means the string-side 104 and the inverter-side 106 cable section of string lines 102a, 102b carry the hazardous contact voltage of the entire string 20.

WO 2014/122325 A1 describes a method for testing the string-side section 104 of the string lines 102a, 102b. The present disclosure now, in particular, relates to the testing of the inverter-side section 106 of the string lines 102a, 102b. This inverter-side section 106 may be tested in an inverter-side testing process prior to performing further test and startup processes, in particular those described in WO 2014/122325 A1, in order to determine that no hazardous open contact voltage can arise at the inverter-side section 106 of the string lines 102a, 102b.

Figure 5:
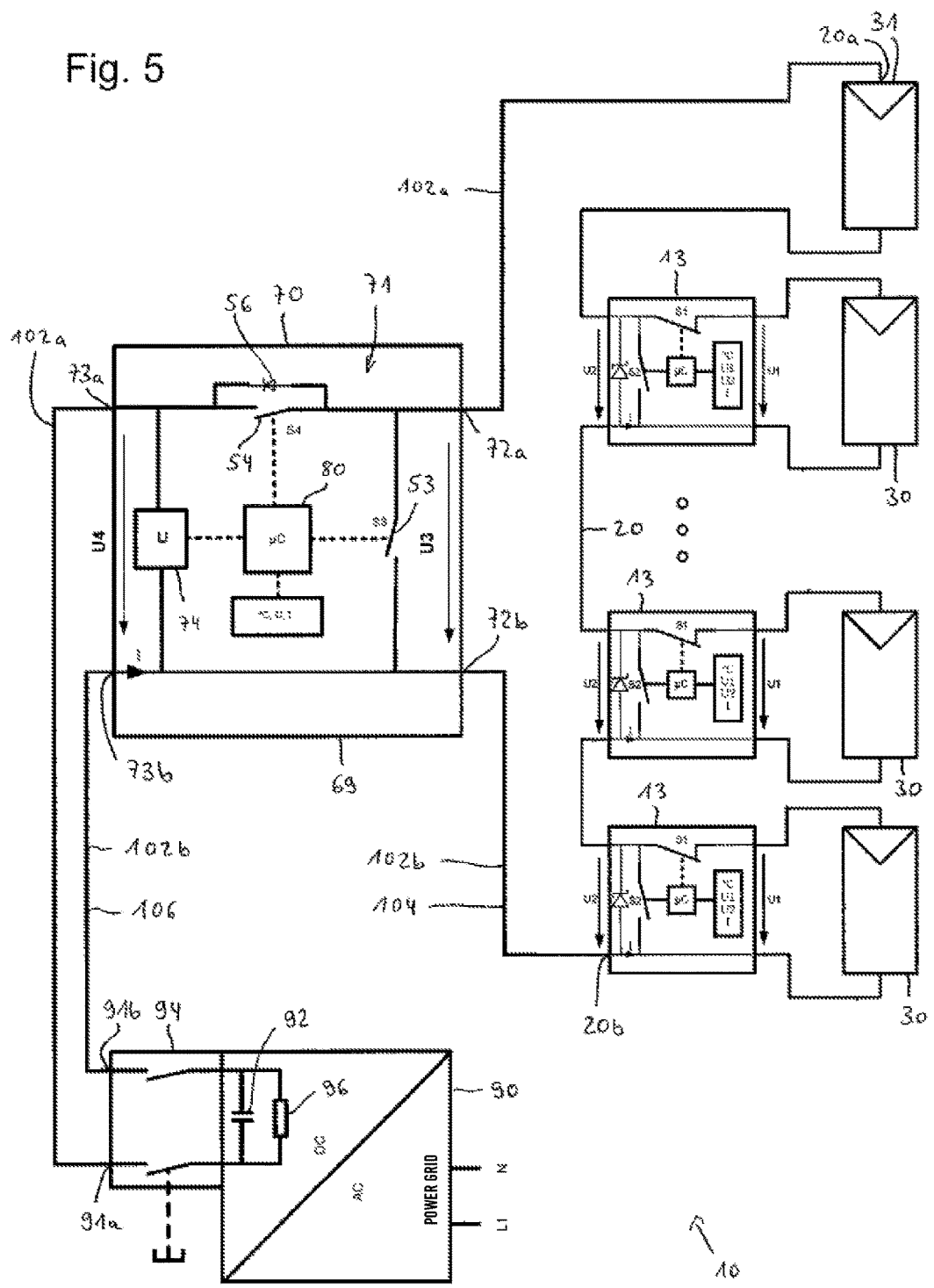
FIG. 5 is a block diagram of an embodiment of the start box with test circuit on a string including series-connected smart solar modules and a startup solar module.
Figure 6:
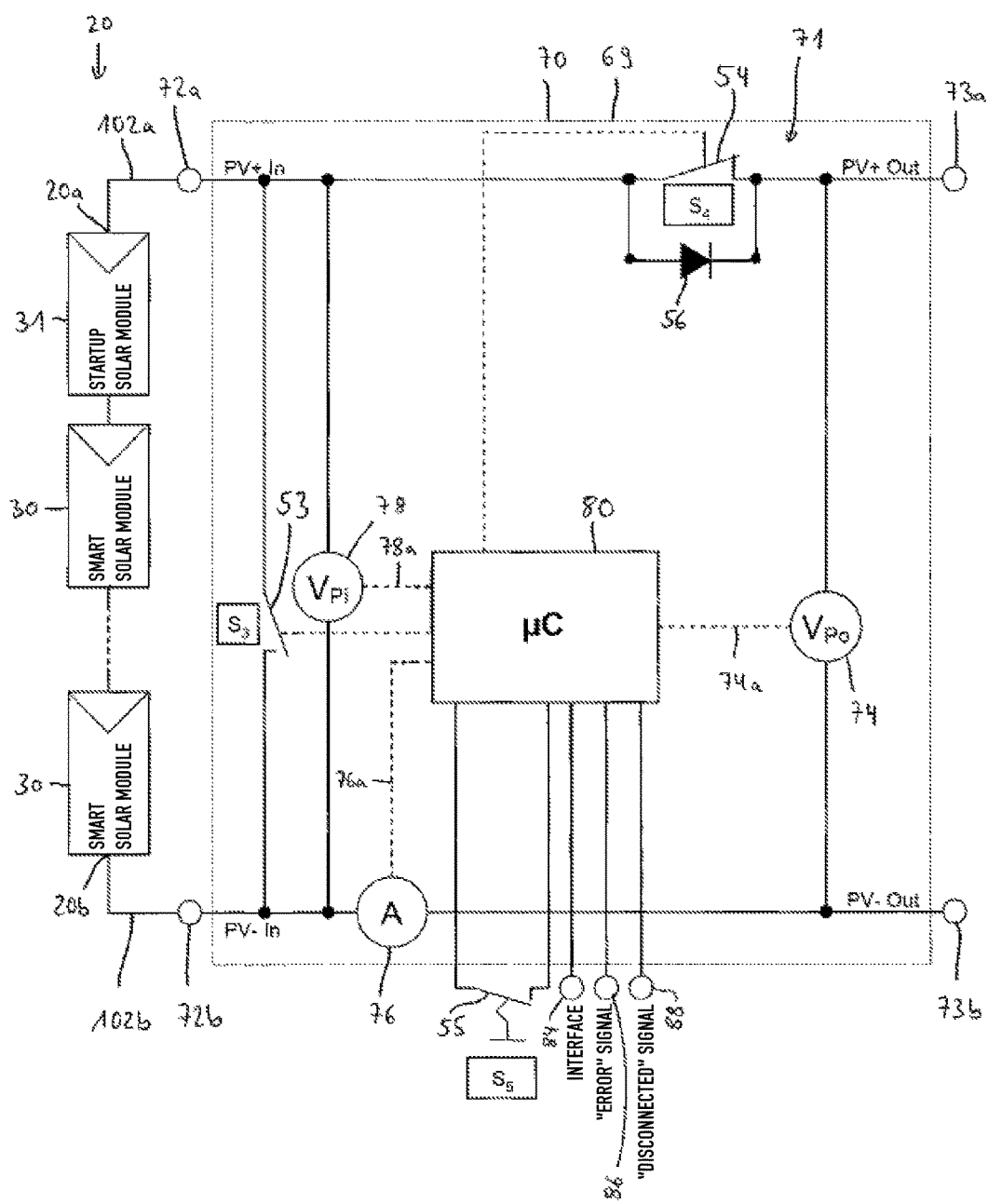
FIG. 6 is a more detailed block diagram of the start box of FIG. 5.

Referring to FIGS. 5 and 6, string 20 consists of a plurality of smart solar modules 30, i.e. solar modules 30 each including a safety circuit 13, and one solar module 31 without such a safety circuit 13. After sunset or in case of maintenance works, the safety circuits 13 of the smart solar modules 30 automatically switch into the safe state, so that they will not apply any voltage to the string without further test and startup processes, even if the sun rises again, for example. This state of the string 20, in which all the smart solar modules 30 are in the safe state, is referred to as a protective state. Solar module 31, by contrast, is permanently connected to the string and feeds solar power into the string 20 when irradiated. This has the advantage that the power from solar module 31 can be used to perform test and startup processes in the photovoltaic system 10, but no hazardous contact voltage will be applied before the present testing processes have been performed and respective enabling conditions have been met. Therefore, solar module 31 is also referred to as a startup solar module 31. It is also possible to provide a few startup solar modules 31 instead of a single startup solar module 31, however, the total voltage of the startup solar modules 31 should be below the threshold for a dangerous contact voltage. In the present example, the single startup solar module 31 has a nominal voltage of 40V.

Start box 70 includes a test circuit or test and enabling circuit 71 with a shunt switch 53 ($S_3$), through which the string-side section 104 of string lines 102a, 102b can be short-circuited, and a serial isolating switch 54 ($S_4$) in one of the two string lines 102a, 102b, through which the inverter-side section 106 can be disconnected from the string-side section 104 at least on one side. Shunt switch 53 and isolating switch 54 are implemented as FETs, shunt switch 53 being configured as a make contact switch, and isolating switch 54 as a break contact switch. Thus, in the normal state shunt switch 53 is open and isolating switch 54 is closed.

Inverter 90 comprises a DC-side input capacitor 92 of, e.g., 1 mF, and a DC isolation device 94 by means of which both poles of the inverter 90 can be electrically isolated from the string lines 102a, 102b on the DC side. DC isolation device 94 (fire emergency switch) may be implemented in the form of a mechanical switch or in the form of a pull-out plug. An objective of the present disclosure is to determine that the inverter 90 is actually connected and that the inverter-side section 106 of the string lines 102a, 102b is closed when the string 20 is to be switched from the protective state into the operating state. For example, the inverter 90 is actually not connected when the DC disconnection device 94 is activated (open) or when the inverter 90 has not yet been installed and connected at all.

In the normal state of switches 53, 54, the input capacitor 92 is maintained in a charged state when the inverter 90 is connected, namely by the voltage of the startup solar module 31 in the embodiment of FIGS. 5 and 6, provided the module 31 is sufficiently irradiated. Thus, in the protective state prior to the start of the inverter-side testing process, switches 53, 54 are in the same state as in the operating state of the photovoltaic system 10. In other words, shunt switch 53 implemented as a make contact switch and/or isolating switch 54 implemented as a break contact switch are in their normal state both during the protective state before the start of the inverter-side testing process and during the operating state of photovoltaic system 10.

Figure 9:
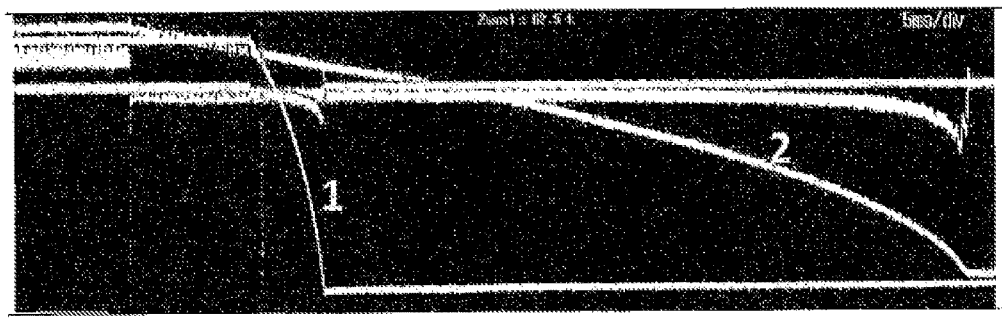
FIG. 9 illustrates voltage drops measured at the inverter-side output of the start box.

When the string 20 is to be switched from the protective state into the operating state, first the inverter-side testing process is performed, under control of the controller or microcontroller 80 of the test circuit 71. In the inverter side testing process, microcontroller 80 opens the isolating switch 54 and closes the shunt switch 53. By opening isolating switch 54, the input capacitor 92 is no longer charged, so that it will be discharged by loss, e.g. on an internal resistor 96 connected in parallel to the input capacitor 92. The test circuit 71 now measures the voltage drop at the inverter-side outputs 73a, 73b of start box 70, by means of an inverter-side voltage sensor 74. The closing of shunt switch 53 prevents the voltage drop measurement from being compromised by a diode 56 parasitic to the isolating switch 54. The duration of the voltage drop is an indicator of the size of the connected capacitor 92. A typical voltage profile as measured when the inverter is connected is designated by reference numeral 2 in FIG. 9. The voltage drop will proceed in about 45 ms. Curve 1 shows the voltage drop if the DC isolation device 94 is activated, i.e. if the inverter 90 is not connected, and in this case the voltage drop takes a few milliseconds. Thus, the inverter-side testing process can be performed within about 100 ms. For example, two voltage readings can be compared for this purpose, one immediately before and one at a predetermined time after the opening of the isolating switch 53, e.g. 5 ms after opening, or the voltage drop profile after the opening is analyzed. On the basis of the measurement result, the microcontroller 80 of test circuit 71 finally determines whether the inverter 90 is connected and whether the inverter-side section 106 of the string lines 102a, 102b is closed or not.

Further testing and in particular startup processes in the string 20 are only initiated by the microcontroller 80 of the test circuit 71 when the determination indicated that the inverter-side section 106 of the string lines 102a, 102b is closed and that the inverter 90 is connected. In this way it is possible to determine, inter alia, that no dangerous open contact voltage is applied to open cable ends of the inverter-side string lines 102a, 102b in the case an inverter 90 has not yet been installed. Furthermore it may be prevented that the string 20 switches from the protective state into the operating state when the DC isolation device 94 of the inverter 90 is activated. So, it can be avoided that a dangerous open contact voltage arises at the inverter-side section 106 of the string lines 102a, 102b or at the inverter 90.

The housing 69 of start box 70 accommodating the test circuit 71 is a voltage-proof housing, optionally with plug-in connectors approved for a hazardous contact voltage, e.g. up to 1000 V, since in the operating state the entire voltage of the string 20 is applied to the test circuit 71 in housing 69. The gate of switch 54 of test circuit 71 is preferably galvanically isolated from the string voltage, e.g. by galvanic pre-isolation and an opto-coupler (not shown).

Figure 7:
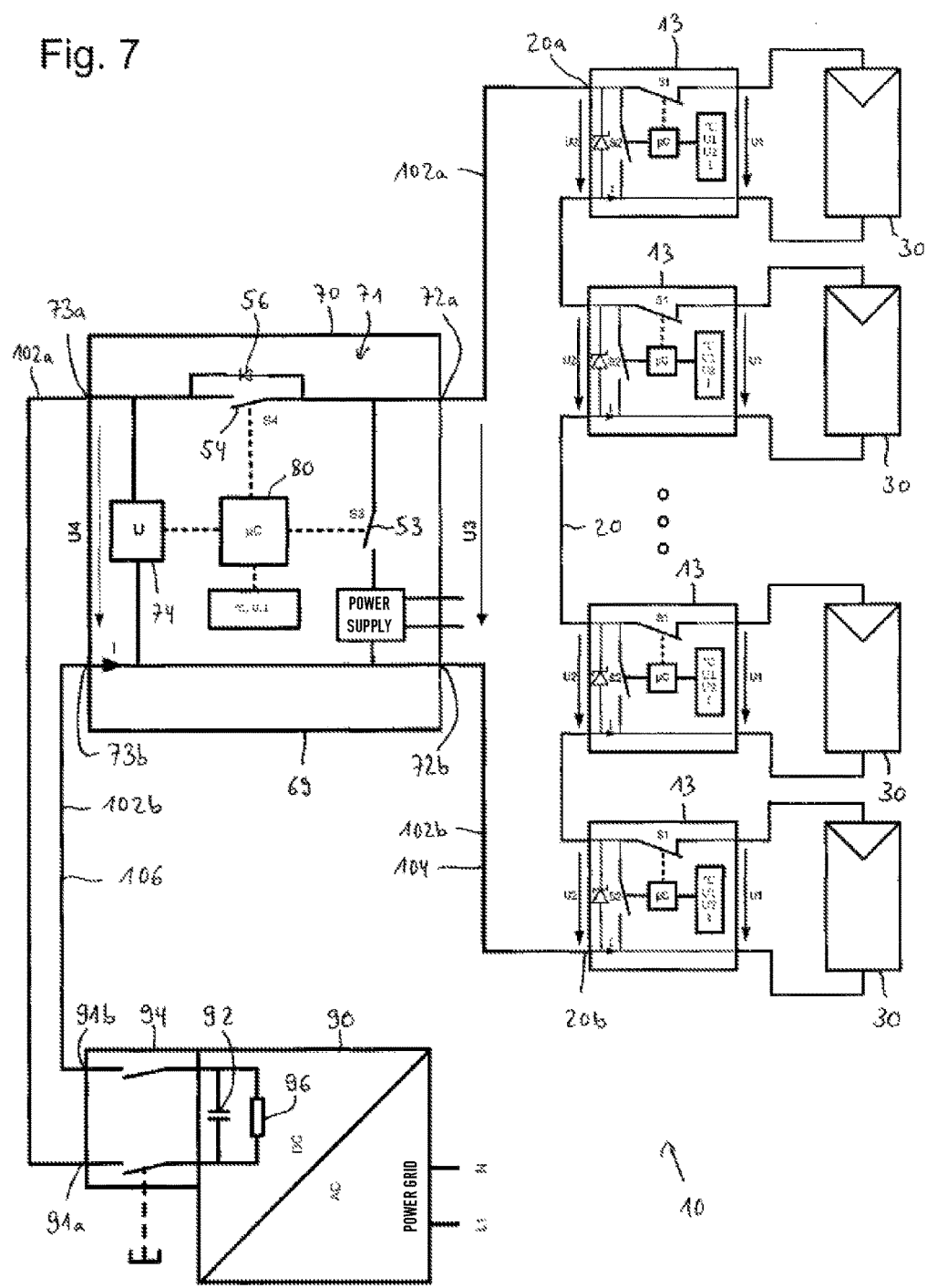
FIG. 7 is a block diagram of an embodiment of the start box with test circuit on a string including only smart series-connected solar modules.
Figure 8:
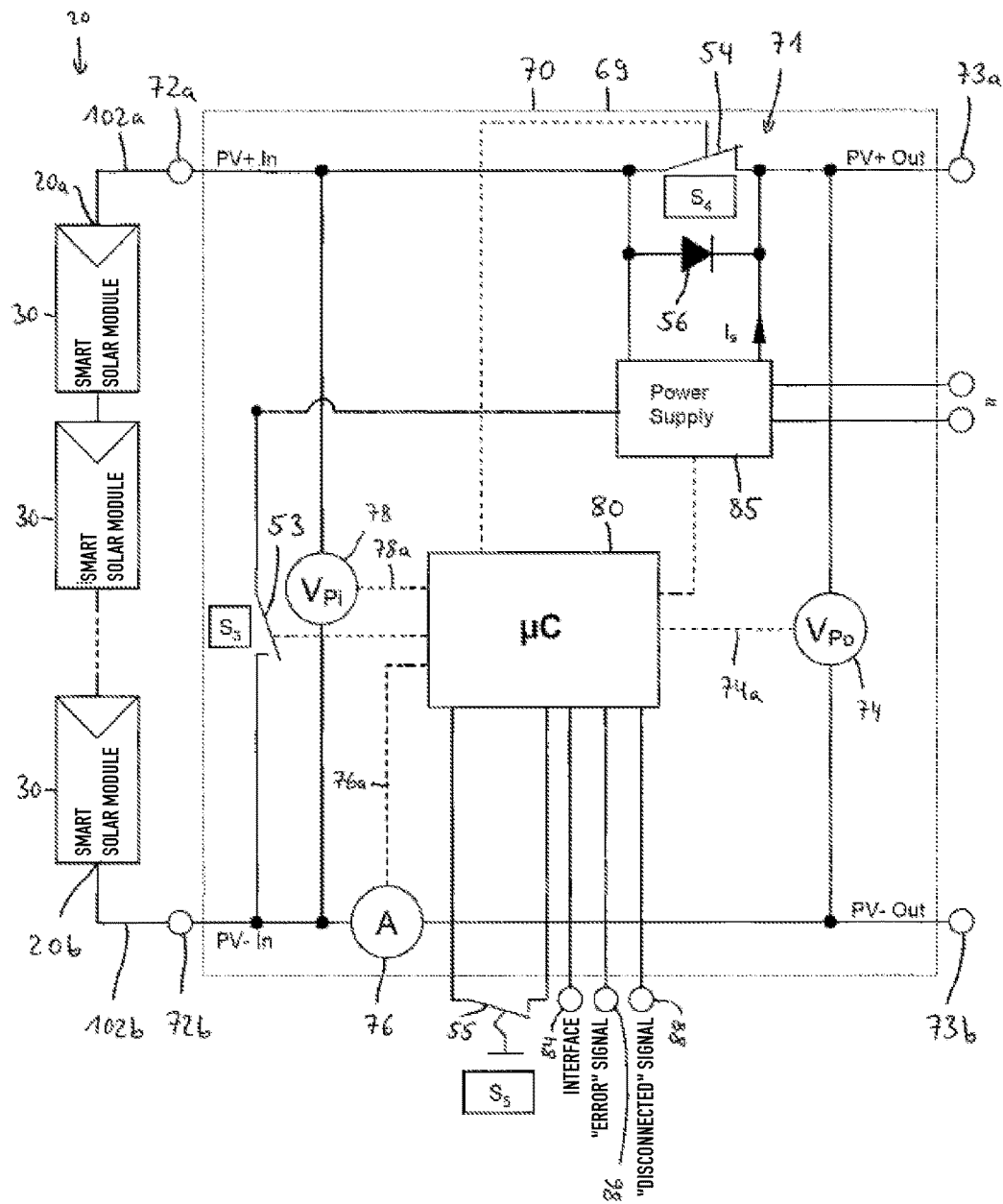
FIG. 8 is a more detailed block diagram of the start box of FIG. 7.

Referring to FIGS. 7 and 8, the string 20 exclusively consists of smart solar modules 30 in this embodiment. In this case, no photovoltaically generated power will be available in the protective state of the string 20. Therefore, the input capacitor 92 of inverter 90 is maintained in the charged state by a power grid adapter of the start box 70.

Figure 10:
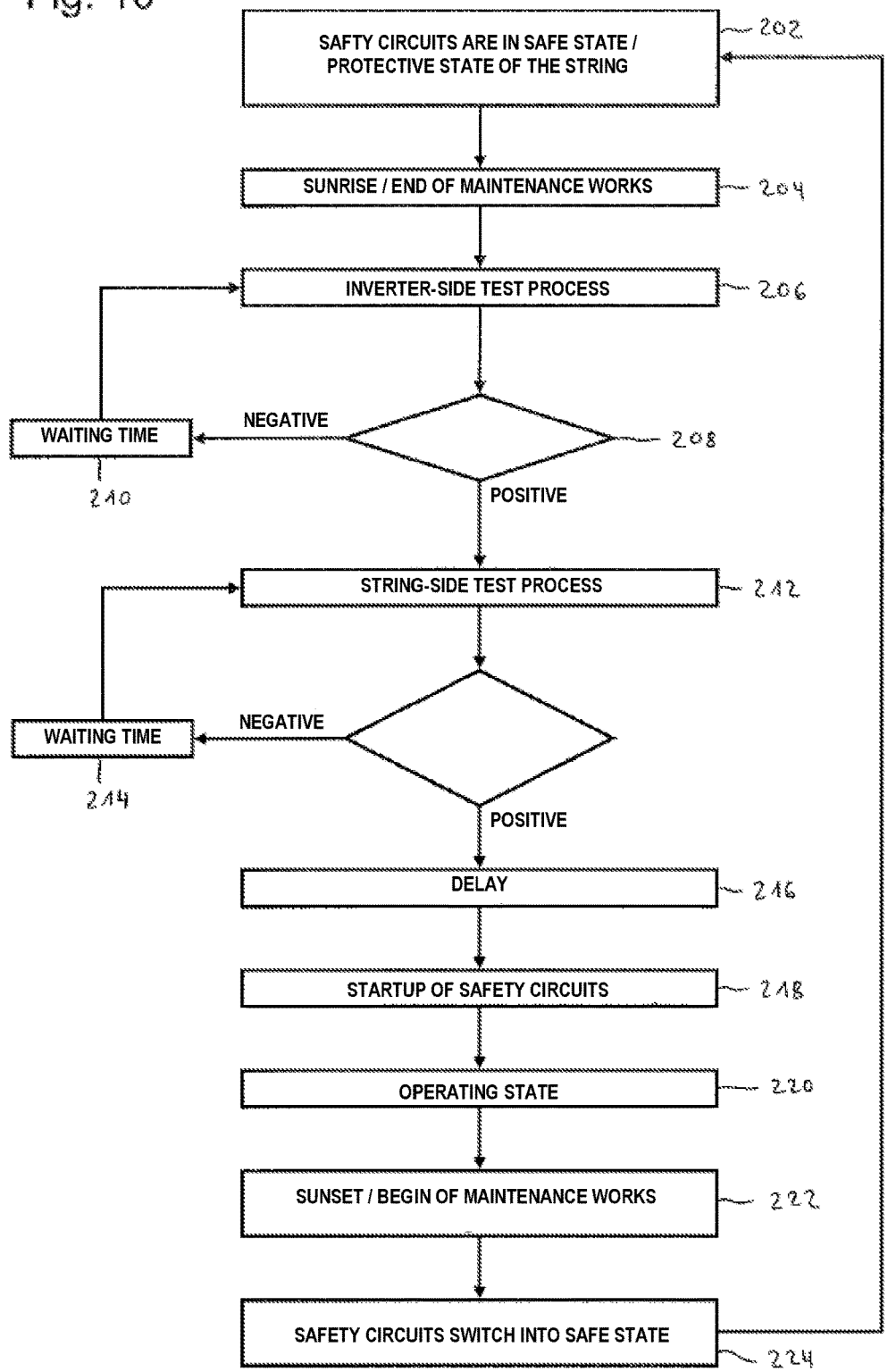
FIG. 10 is a flow chart of the test and enabling processes in the photovoltaic system.

With reference to FIG. 10, an embodiment of the process flow when the photovoltaic system is switched from the protective state into the operating state will now be illustrated.

In the protective state 202 of string 20, all safety circuits 13 of the smart solar modules 30 are in the safe state.

When, at a time 204, the sun rises or maintenance works have been completed, the test circuit 71 performs the inverter-side testing process 206. If the result of the determination of whether the inverter-side section 106 of the string lines 102a, 102b is closed and whether the inverter 90 is connected in step 208 is negative, the inverter side testing process 206 is repeated after a waiting time 210 of, e.g., 30s, until the result in step 208 is positive. Thus, if the result of the determination in step 208 is that there is an inverter-side interruption, the string 20 will not be switched into the operating state, rather the inverter-side testing process 206 is repeated after a predetermined waiting time 210 until the result is positive.

When the result is positive, a string-side testing process 212 is performed for checking whether the string-side section 104 of the string lines 102a, 102b is closed. If the result is negative, the string-side testing process 212 is also repeated after a waiting time 214 until the result is positive.

When the result is positive, and after a delay 216, the test circuit 71 allows the safety circuits 13 to startup and enable the safety circuits 13 of the smart solar modules 30 in a step 218, i.e. switches from the safe state into the operating state 220 in which the string 20 then feeds photovoltaic power to the inverter 90.

In a step 224, the safety circuits 13 automatically switch into the safe state, for example when the sun goes down at a time 222, or when the safe state is manually initiated at time 222, e.g. if maintenance work is to be carried out.

Below, an example of the string-side test and startup process 212-218 shall additionally be explained.

A voltage sensor 78 ($V_{pi}$) measures the string-side voltage U3. A current sensor 76 (A) measures the current through the string, which can be either the photovoltaically generated solar current in the operating state or the starting current in the protective state. Microcontroller 80 is connected to the inverter-side voltage sensor 74 ($V_{Po}$), the current sensor 76, and the string-side voltage sensor 78, via links 74a, 76a, 78a, respectively, to read them out in order to measure the string voltage U3, the current in the string, and the voltage drop U4 across the inverter side output 73a, 73b, and to control the test circuit 71 in start box 70 in response to one or more of these readings.

In the operating state of photovoltaic system 10 as shown in FIGS. 6 and 8, the isolating switch 54 is closed and the shunt switch 53 is open, so that the illustrated test circuit 71 is almost lossless in this state and the photovoltaically generated current can flow to the inverter 90 through the test circuit 71 almost without loss.

To start the smart solar modules 30, the isolating switch 54 is opened and the shunt switch 53 is closed. Now, a starting current $I_s$ is injected into the string 20 for a predetermined time $t_s$. The photovoltaic system 10, i.e. the solar modules 30 are initially still in the safe state, so that on the one hand the starting current injected into the string 20 can flow through the string, and on the other hand the maximum current photovoltaically generated by the startup solar module 31 will flow through the string 20 in the example of FIG. 6.

Thus, in the protective state of the string 20, the circuit of the string 20 and the string-side section 104 of the string lines 102a, 102b is closed, unless in case of a fault, notwithstanding the fact that the solar modules 30 are individually disconnected. The injected starting current Is initiates a current flow through the string 20 and the string-side section 104 of the string lines 102a, 102b, which is measured or detected by the current sensors 68. In response to this measurement or detection result, the safety circuits 13 will then automatically switch from the safe state into the operating state.

Once, all smart solar modules 30 have been activated in response thereto, i.e. switched from the safe state into the operating state, the shunt switch 53 is opened again and the isolating switch 54 is closed again, so that now the photovoltaically generated current can flow through the string 20, string lines 102a, 102b, and the test circuit 71, or start box 70, to the inverter 90, and the corresponding photovoltaic power can be fed into the power grid.

Furthermore, a manual enabling switch 55 (S5) at the start box 70 can also be used to manually initiate the test and startup processes, i.e. to manually start the photovoltaic system 10 and switch the string 20 from the protective state into the operating state. Via an electronic interface 84 of the microcontroller 80, this information can be read out, for example using a computer. Microcontroller 80, furthermore, has signaling means 86, 88, for example in the form of light-emitting diodes, which signal a possible error state ("ERROR") or the presence of the safe state ("DISCONNECTED") at the start box 70.

The testing and/or power-up processes may furthermore be initiated via the interface 84 ("INTERFACE") by a higher-level controller, or the digital input to which the enabling switch 55 is connected can be switched using a higher-level controller.

In daily normal operation at sunrise, the test circuit 71 performs the inverter-side testing process 206, the string-side testing process 212, and the startup step 218 so as to ensure the yield of the system. This may be initiated at predefined points in time in response to a timer or by reading out an irradiation sensor of the start box 70.

After sunrise, the microcontrollers 40 of safety circuits 13 are supplied with energy by the associated solar modules 30, so that they are energetically enabled to control the safety circuits 13 and switch them from the safe state into the operating state, even in the initially present protective state.

For startup, the test circuit 71 injects the starting current Is from power source 82 into the string 20, with the isolating switch 54 already in the open state or by opening it, and by closing the shunt switch 53, which starting current is detected by the safety circuits 13 which are still in the safe state, using the current sensor 68, and in response thereto, the microcontroller 40 controls the safety circuit 13 to switch from the safe state into the operating state, in the present example by closing the isolating switch 51 and opening the short-circuiting switch 52.

In this way, it is possible that the initiation of the startup processes of the smart solar modules 30 only succeeds if the string lines 102a, 102b are closed both on the inverter side and on the string side of the start box 70 and if the inverter 90 is actually connected, so that there is no point in the cabling between the solar modules 30, 31 and the inverter 90 where a dangerous open voltage might arise.

Otherwise, as to the string-side testing and startup processes, reference is made to WO 2014/122325.

It will be apparent to those skilled in the art that the embodiments described above are meant to be illustrative and that the invention is not limited thereto but may be varied in many ways without departing from the scope of the claims. Furthermore, it will be apparent that irrespective of whether disclosed in the description, the claims, the figures, or otherwise, the features individually define essential components of the present disclosure, even if they are described together with other features. Furthermore, the features described in the context of the photovoltaic system also relate to the test circuit and accordingly to the testing method, and vice versa.

The invention claimed is:

1. A photovoltaic system, comprising
   at least one string of series-connected solar modules and an inverter for converting direct current generated by the string,
   wherein in a normal state, a positive end of the string is connected via a positive pole string line to the positive pole DC input of the inverter, and a negative end of the string is connected via a negative pole string line to the negative pole DC input of the inverter; and further comprising:
   a test circuit connected in the positive pole string line between the positive end of the string and the positive pole DC input, and/or in the negative pole string line between the negative end of the string and the negative pole DC input of the inverter;
   wherein the test circuit includes a first switch for disconnecting the positive pole string line between the positive end of the string and the positive pole DC input of the inverter, or for disconnecting the negative pole string line between the negative end of the string and the negative pole DC input of the inverter;
   wherein the inverter includes a DC-side capacitor;
   wherein, in an inverter-side testing process, the test circuit opens the first switch so as to disconnect the DC-side capacitor of the inverter from the string from a voltage supply of the test circuit at one side;
   and wherein the test circuit is responsive to a voltage drop caused by the disconnection of the DC-side capacitor of the inverter to determine whether the inverter is actually connected to the string lines at that moment, and/or whether the inverter-side section of the string lines is closed or not.

2. The photovoltaic system as claimed in claim 1, wherein the test circuit comprises means which are responsive to the voltage drop to switch the string from a protective state into an operating state; or vice versa.

3. The photovoltaic system as claimed in claim 1, comprising an isolation device by means of which the inverter-side section of the string lines can be disconnected.

4. The photovoltaic system as claimed in claim 1, wherein
   i) if the result of the determination of the voltage drop in the inverter-side testing process indicates that the inverter is connected to the string lines and that the inverter-side section of the string lines is closed, the test circuit initiates further testing and/or startup processes in the string to put the string into the operating state; and
   ii) if the result of the determination of the voltage drop indicates that the inverter is not connected to the string lines or that the inverter-side section of the string lines is interrupted, the test circuit does not put the string into the operating state, the first switch is closed again, and the inverter-side testing process is repeated after a predetermined timed until the result of the determination of the voltage drop indicates that the inverter is connected to the string lines and/or that the inverter-side section of the string lines is closed.

5. The photovoltaic system as claimed in claim 1, wherein the test circuit determines the voltage drop by comparing the voltages before and after opening the first switch, and/or by a voltage waveform measurement after opening the first switch.

6. The photovoltaic system as claimed in claim 1, wherein the test circuit is connected in the positive pole string line and/or in the negative pole string line remote from the solar modules.

7. The photovoltaic system as claimed in claim 1, wherein the test circuit is accommodated in a start box, and wherein the start box is connected in the positive pole string line between the positive end of the string and the positive pole DC input of the inverter and in the negative pole string line between the negative end of the string and the negative pole DC input of the inverter, so that the positive pole string line and the negative pole string line are electrically routed through the start box.

8. The photovoltaic system as claimed in claim 7, wherein the start box is connected in the positive pole string line and/or in the negative pole string line remote from the solar modules such that the positive pole string line is formed by a string-side section extending from the positive end of the string to the start box and an inverter-side section extending from the start box to the positive pole inverter input, and/or the negative pole string line is formed by a string-side section extending from the negative end of the string to the start box and an inverter-side section extending from the start box to the negative pole inverter input.

9. The photovoltaic system as claimed in claim 1, wherein the test circuit comprises a second switch arranged on the string side of the first switch, for short-circuiting the first and second string lines on the string side of the first switch when the inverter-side testing process determines the voltage drop across the DC-side capacitor of the inverter.

10. The photovoltaic system as claimed in claim 1, wherein the first and/or second switches are implemented as semiconductor switching elements.

11. The photovoltaic system as claimed in claim 1, wherein the first switch is configured as a break contact switch which is closed in its normal state, and/or the second switch is configured as a make contact switch which is open in its normal state.

12. The photovoltaic system as claimed in claim 1, wherein the solar modules each comprise a solar junction box through which the connection elements of the associated solar module are electrically connected, and wherein some of the solar modules include a safety circuit which defines an operating state and a safe state, wherein in the operating state the respective solar module feeds solar power to the string lines, and in the safe state it does not feed solar power to the string lines.

13. The photovoltaic system as claimed in claim 12, wherein the string comprises a plurality of solar modules which include the safety circuit and a startup solar module which feeds solar power into the string lines even when the solar modules which include the safety circuit are in the safe state.

14. The photovoltaic system as claimed in claim 12, wherein, if the result of the determination of the voltage drop in the inverter-side testing process indicates that the inverter is connected to the string lines and that the inverter-side section of the string lines is closed, the test circuit initiates a string-side testing process which checks whether the circuit of the string lines on the string-side of the test circuit is closed, and if the test result is positive, puts the safety circuits of the solar modules into the operating state, so that the string provides electrical power to the inverter.

15. The photovoltaic system as claimed in claim 12, wherein the DC-side capacitor of the inverter is charged prior to the inverter-side testing process by the one or more startup solar module(s) or by a power supply of the test circuit order to ensure a charged state of the DC-side capacitor of the inverter at the time the first switch is opened for the inverter-side testing process.

16. A test circuit, in particular as claimed in claim 1, for performing an inverter-side testing process in a photovoltaic system which comprises a string of series-connected solar modules and an inverter for converting the direct current generated by the string, wherein in a normal state, a positive end of the string is connected via a positive pole string line to the positive pole DC input of the inverter, and a negative end of the string is connected via a negative pole string line to the negative pole DC input of the inverter;

wherein the test circuit is connectable in the positive pole string line between the positive end of the string and the positive pole DC input of the inverter, and/or in the negative pole string line between the negative end of the string and the negative pole DC input of the inverter;

wherein the test circuit includes a first switch for disconnecting the positive pole string line between the positive end of the string and the positive pole DC input of the inverter, or for disconnecting the negative pole string line between the negative end of the string and the negative pole DC input of the inverter;

wherein, in an inverter-side testing process, the test circuit (71) opens the first switch, so as to disconnect a DC-side capacitor of the inverter from the string and/or from a voltage supply of the test circuit, at one side, and wherein in response to the voltage drop caused by the disconnection of the DC-side capacitor of the inverter, the test circuit determines whether the inverter is actually connected to the string lines at that moment, and/or whether the inverter-side section of the string lines is closed or not.

17. A testing method for a photovoltaic system, comprising:

a string of series-connected solar modules and an inverter for converting direct current generated by the string, which is connected to the string lines in a normal state;

wherein in a protective state of the string, in which some of the solar modules of the string are disconnected such that the string does not apply any hazardous contact voltage to the string lines in the protective state, the following steps are performed:

a) prior to an inverter-side testing process, maintaining a DC-side capacitor of the inverter in a charged state by a starting voltage which is reduced compared to the string voltage; and subsequently b) performing the inverter-side testing process, in which the DC-side capacitor of the inverter is disconnected from the starting voltage on one side; and c) in response to a voltage drop caused by the disconnection of the DC-side capacitor of the inverter, determining whether the inverter is actually connected to the string lines at that moment and/or whether the inverter-side section of the string lines is closed or not.

\* \* \* \* \*